(12) United States Patent
Huang et al.

(10) Patent No.: US 9,281,307 B2
(45) Date of Patent: Mar. 8, 2016

(54) PLASMA DOPING TO REDUCE DIELECTRIC LOSS DURING REMOVAL OF DUMMY LAYERS IN A GATE STRUCTURE

(71) Applicant: TAIWAN SEMICONDUCTOR MANUFACTURING COMPANY, LTD., Hsinchu (TW)

(72) Inventors: Yu-Lien Huang, Jhubei (TW); Chia-Pin Lin, Xinpu Township (TW); Sheng-Hsiung Wang, Zhubei (TW); Fan-Yi Hsu, Toufen Town (TW); Chun-Liang Tai, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 13/854,251

(22) Filed: Apr. 1, 2013

(65) Prior Publication Data
US 2013/0228871 A1    Sep. 5, 2013

Related U.S. Application Data

(62) Division of application No. 13/077,358, filed on Mar. 31, 2011, now Pat. No. 8,431,453.

(51) Int. Cl.
*H01L 27/088* (2006.01)
*H01L 29/66* (2006.01)
*H01L 29/51* (2006.01)

(52) U.S. Cl.
CPC ........ *H01L 27/088* (2013.01); *H01L 29/66545* (2013.01); *H01L 29/513* (2013.01)

(58) Field of Classification Search
CPC ............... H01L 27/088; H01L 29/513; H01L 29/66545
USPC .......................................................... 257/368
See application file for complete search history.

(56) References Cited

U.S. PATENT DOCUMENTS

| 5,316,965 | A  | * | 5/1994 | Philipossian et al. | 438/424 |
|---|---|---|---|---|---|
| 5,933,739 | A  | * | 8/1999 | Lin | 438/301 |
| 6,180,997 | B1 | * | 1/2001 | Lin | 257/637 |
| 7,163,853 | B2 | * | 1/2007 | Tu | 438/183 |
| 7,422,936 | B2 | * | 9/2008 | Barns et al. | 438/183 |
| 7,804,130 | B1 |   | 9/2010 | Fung | |
| 7,902,058 | B2 | * | 3/2011 | Datta et al. | 438/592 |
| 7,989,900 | B2 | * | 8/2011 | Haensch et al. | 257/407 |
| 8,178,433 | B2 | * | 5/2012 | Biery et al. | 438/592 |

(Continued)

FOREIGN PATENT DOCUMENTS

EP    1 152 460    11/2001

OTHER PUBLICATIONS

Office Action dated Jan. 22, 2014 from corresponding application No. TW 100125078.

(Continued)

*Primary Examiner* — Mary Wilczewski
(74) *Attorney, Agent, or Firm* — Hauptman Ham, LLP

(57) ABSTRACT

A semiconductor device which includes a first gate structure on a substrate and a second gate structure on the substrate is provided. The semiconductor device further includes an inter-level dielectric (ILD) layer on the substrate between the first gate structure and the second gate structure, wherein a top portion of the ILD layer has a different etch selectivity than a bottom portion of the ILD layer.

18 Claims, 7 Drawing Sheets

(56) References Cited

U.S. PATENT DOCUMENTS

| | | | |
|---|---|---|---|
| 8,465,662 B2 * | 6/2013 | Lim et al. | 216/99 |
| 2001/0049183 A1 | 12/2001 | Henson et al. | |
| 2009/0098706 A1 | 4/2009 | Kim et al. | |

OTHER PUBLICATIONS

Office Action dated Dec. 9, 2013 from corresponding application No. CN 201210020656.0.

* cited by examiner

PLASMA DOPING TO REDUCE DIELECTRIC LOSS DURING REMOVAL OF DUMMY LAYERS IN A GATE STRUCTURE

CROSS REFERENCES TO RELATED APPLICATIONS

The present application is a divisional of U.S. application Ser. No. 13/077,358, filed Mar. 31, 2011, which is incorporated herein by reference in its entirety.

The present application is related to U.S. patent application Ser. No. 12/941,509, entitled "MECHANISMS FOR FORMING ULTRA SHALLOW JUNCTION," filed on Nov. 8, 2010 and U.S. patent application Ser. No. 13/012,948, entitled "DOPED OXIDE FOR SHALLOW TRENCH ISOLATION (STI)," both of which are incorporated herein by reference in their entireties.

FIELD

The present disclosure relates to a mechanism of fabricating a gate structure for a semiconductor device. Particularly, the disclosure relates to a mechanism of fabricating a replacement gate structure.

BACKGROUND

As technology nodes shrink, in some IC designs, there has been a desire to replace the typically polysilicon gate electrode with a metal gate electrode to improve device performance with the decreased feature sizes. Providing metal gate structures (e.g., including a metal gate electrode rather than polysilicon) offers one solution. One process of forming a metal gate stack is termed a "gate last" process in which the final gate stack is fabricated "last" which allows for a reduced number of subsequent processes, including high temperature processing, that must be performed after formation of the gate. Additionally, as the dimensions of transistors decrease, the thickness of the gate oxide must be reduced to maintain performance with the decreased gate length. In order to reduce gate leakage, high dielectric constant (high-k) gate insulator layers are also used which allow greater physical thicknesses while maintaining the same effective thickness as would be provided by a typical gate oxide used in larger technology nodes.

In addition to the introduction of gate last processes, other features and processes have been introduced in complementary metal-oxide-silicon (CMOS) fabrication to improve the device performance. The integration of the CMOS fabrication process flow for advanced technology nodes to produce devices with good performance and high yield has many challenges.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following description provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

With reference to FIGS. 1A-1F, cross-sectional views of processing a semiconductor device structure 100 are described below, in accordance with some embodiments. The semiconductor device structure 100 illustrates an integrated circuit, or portion thereof, that can comprise memory cells and/or logic circuits. The semiconductor device structure 100 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors, other suitable components, and/or combinations thereof. It is understood that additional processing operations can be provided before, during, and/or after the sequence described below. Further, some of the operations described below can be replaced or eliminated, for additional embodiments of the processing sequence (or method). It is further understood that additional features can be added in the semiconductor device structure 100, and some of the features described below can be replaced or eliminated, for additional embodiments of the semiconductor device structure 100.

Figure 1A:
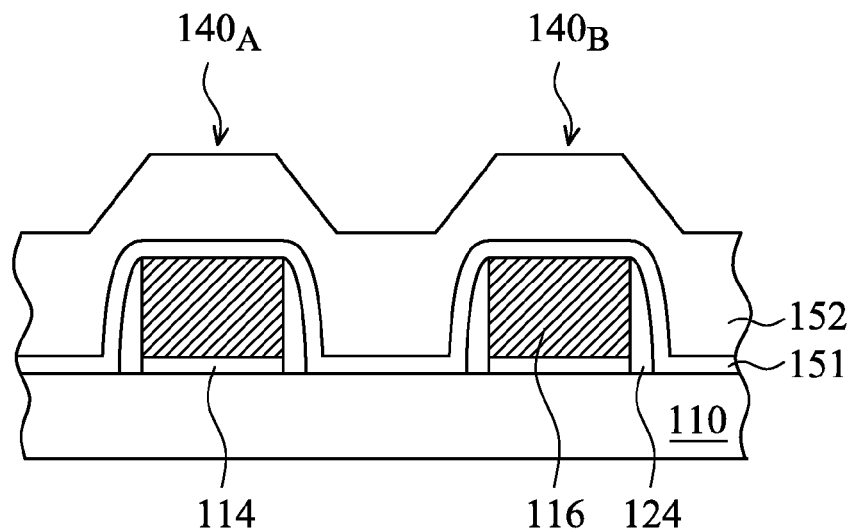
FIGS. 1A-1F show cross-sectional views of processing a semiconductor device structure, in accordance with some embodiments.

FIG. 1A shows a substrate 110. In the present embodiment, the substrate 110 is a semiconductor substrate comprising silicon. Alternatively, the substrate 110 comprises an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epitaxial (epi) layer. In other examples, the silicon substrate may include a multilayer compound semiconductor structure.

The substrate 110 may include various doped regions depending on design requirements (e.g., p-type wells or n-type wells). The doped regions may be doped with p-type dopants, such as boron or $BF_2$, and/or n-type dopants, such as phosphorus or arsenic. The doped regions may be formed directly on the substrate 110, in a P-well structure, in an N-well structure, in a dual-well structure, or using a raised structure. The semiconductor substrate 110 may further include various active regions, such as regions configured for an N-type metal-oxide-semiconductor transistor device (referred to as an NMOS) and regions configured for a P-type metal-oxide-semiconductor transistor device (referred to as a PMOS). For example, substrate 110 may have dopant regions and epitaxial layers formed to define source and drain regions. It is understood that the semiconductor device structure 100 may be formed by CMOS technology processing, and thus some processes are not described in detail herein.

Substrate 110 may also include isolation regions (not shown), which are formed to isolate various regions, such as NMOS and PMOS regions, of the substrate 110. The isolation regions utilize isolation technology, such as local oxidation of silicon (LOCOS) or shallow trench isolation (STI), to define and electrically isolate the various regions. If the isolation regions are made of STIs, each STI region comprises silicon oxide, silicon nitride, silicon oxynitride, other suitable materials, or combinations thereof. The STIs may be formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric materials. In some examples, the filled trench may have a multi-layer structure such as a thermal oxide liner layer filled with silicon nitride or silicon oxide.

FIG. 1A further illustrates that gate structures, such as $140_A$ and $140_B$, comprising a gate dielectric 114, and a gate electrode layer 116, are formed by any suitable process. The gate dielectric layer 114 is formed over the substrate 110 by any suitable process to any suitable thickness. The gate dielectric layer 114, for example, is made of silicon oxide, silicon oxynitride, silicon nitride, in-situ steam glass (ISSG), spin-on glass (SOG), fluorinated silica glass (FSG), carbon doped silicon oxide, BLACK DIAMOND® (from Applied Materials of Santa Clara, Calif.), Xerogel, Aerogel, amorphous fluorinated carbon, Parlyene, BCB (bis-benzocyclobutenes), SILK™ (from Dow Chemical, Midland, Mich.), polyimide, other suitable dielectric materials, or combinations thereof. The gate dielectric layer 114 may comprise a high-k dielectric material, such as $HfO_2$, HfSiO, HfSiON, HfTaO, HfSiO, HfZrO, other suitable high-k dielectric materials, and/or combinations thereof. The gate dielectric layer 114 can further include an interfacial layer, which comprises a grown silicon oxide layer (e.g., thermal oxide or chemical oxide) or silicon oxynitride (SiON). The gate dielectric layer 114 has a thickness in a range from about 10 angstroms (Å) to about 100 Å, in accordance with some embodiments. In some other embodiments, the gate dielectric layer 114 has a thickness in a range from about 10 angstroms (Å) to about 50 Å, in accordance with some embodiments.

The gate electrode layer 116 is formed over the gate dielectric layer 114 by any suitable process to any suitable thickness. In the present embodiment, the gate electrode layer 116 is a polysilicon layer. The polysilicon (or poly) layer is formed by chemical vapor deposition (CVD) or other suitable deposition process. For example, silane ($SiH_4$) may be used as a chemical gas in the CVD process to form the gate electrode layer 116. The gate electrode layer 116 has a thickness in a range from about 400 angstroms (Å) to about 1000 Å, in accordance with some embodiments. In some other embodiments, the gate electrode layer 116 has a thickness in a range from about 600 angstroms (Å) to about 900 Å. In some embodiments, gate electrode layer 116 and the gate dielectric layer 114 are sacrificial (or dummy) layers and will be removed by a replacement step after a gate patterning process. In some other embodiments, the gate electrode layer 116 is a dummy layer. However, the gate dielectric layer 114 is not a dummy layer and will not be removed by a replacement step after a gate patterning process.

A hard mask layer (not shown) and a layer of photoresist (not shown) may be formed over the gate electrode layer 116 to assist the patterning of the gate structures $140_A$ and $140_B$. The layer of photoresist is patterned to form a patterned photoresist feature. The pattern of the photoresist can then be transferred by a dry etching process to the underlying gate dielectric layer 114, the gate electrode layer 116, and the hard mask layer to form the gate structures, $140_A$ and $140_B$. Additionally, an anti-reflective coating (ARC) layer (not shown) may be formed on the hard mask layer and under the layer of photoresist to enhance the subsequent patterning process. The photolithography patterning processes may include soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. Then, an etching process, including dry etching, wet etching, and/or other etching methods (e.g., reactive ion etching) is provided to from the gate structures $140_A$ and $140_B$. The photoresist layer is stripped thereafter. The hard mask layer is also removed. It is understood that the above examples do not limit the processing steps that may be utilized to form the gate structures.

After the gate structures, $140_A$ and $140_B$, are formed, spacers 124 are formed overlying sidewalls of the gate structures $140_A/140_B$, in accordance with some embodiments. In an example, spacers 124 are formed by blanket depositing a dielectric layer over the gate structures $140_A/140_B$ and the substrate 110, and then the dielectric layer is etched to form spacers 124. In some embodiments, the spacers 124 are formed of more than one layer of dielectric materials. The dielectric layer(s) used to form spacers 124 may comprise, for example, silicon nitride, silicon oxide, silicon carbide, silicon oxynitride, nitride silicon carbide (SiCN), other suitable materials, and/or combinations thereof. The thickness of the dielectric layer is in a range from 50 Å to about 400 Å. The dielectric layer may be formed by using techniques such as plasma enhanced chemical vapor deposition (PECVD), low-pressure chemical vapor deposition (LPCVD), sub-atmospheric chemical vapor deposition (SACVD), atomic layer deposition (ALD), or plasma-enhanced ALD (PEALD), and the like. The etching may be performed by a wet etching process, a dry etching process, or combinations thereof. Preferably, the dielectric layer is etched by a dry etching process. More preferably, the dielectric layer is etched by an anisotropic dry etching process.

FIG. 1A also shows that a contact etch stop layer (CESL) 151 and an inter-metal dielectric layer before first metal layer (ILD0) 152 have been deposited. CESL 151 is made of a dielectric material, such as silicon nitride, silicon oxynitride, or other suitable materials. CESL 151 has high etch selectivity in comparison with ILD0 152 and the gate dielectric layer 114 to allow proper contact etching. The thickness of CESL 151 ranges from about 100 Å to about 800 Å. CESL 151 may be formed by using techniques such as plasma enhanced chemical vapor deposition (PECVD), low-pressure chemical vapor deposition (LPCVD), sub-atmospheric chemical vapor deposition (SACVD), atomic layer deposition (ALD), or plasma-enhanced ALD (PEALD), and the like.

ILD0 152 is made of a dielectric material, such as an oxide, a doped oxide, a low-dielectric-constant (low-k) dielectric, or other suitable materials, and/or combinations thereof. The thickness of the dielectric layer ranges from 1000 Å to about 5000 Å. The ILD0 152 is made of, for example, silicon oxide, silicon oxynitride, silicon nitride, spin-on glass (SOG), fluorinated silica glass (FSG), carbon doped silicon oxide, BLACK DIAMOND®, Xerogel, Aerogel, amorphous fluorinated carbon, Parlyene, BCB (bis-benzocyclobutenes), SILK™, polyimide, other suitable dielectric materials, or combinations thereof. ILD0 152 may also be doped with a dopant, such as phosphorous (P), which can help getter ions. ILD0 152 may be formed by using techniques such as spin-on, plasma enhanced chemical vapor deposition (PECVD), low-pressure chemical vapor deposition (LPCVD), sub-atmospheric chemical vapor deposition (SACVD), high-density plasma CVD (HDPCVD), and the like.

As mentioned above, the gate electrode layer 116 and the gate dielectric layer 114 are dummy layers, in accordance with some embodiments. The dummy gate electrode layer 116 and the gate dielectric layers are removed by etching to allow different material layers to be deposited in the opening created (or formed) by removing the dummy gate electrode layer. In some embodiments, the gate electrode layer 116 is a dummy layer, but the gate dielectric layer 114 is not a dummy layer and is not removed. The different material layers may include, but are not limited to, an oxide dielectric layer, a high dielectric constant (high-k) dielectric layer, a barrier layer, a work function layer, a gate electrode (or gate metal) layer, etc. Exemplary details about the various material layers in a replacement gate structure are described in U.S. patent application Ser. No. 12/702,525, titled "Integration of Bottom-Up Metal Film Deposition" and filed on Feb. 9, 2010, which is incorporated by reference herein in its entirety.

Figure 1B:
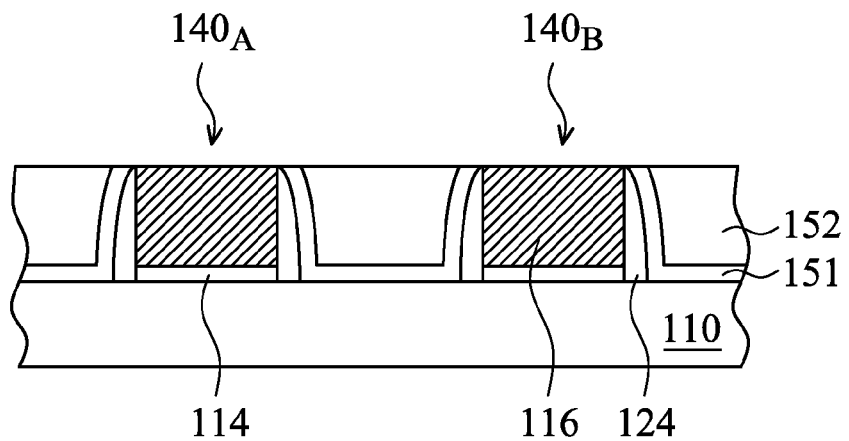

FIG. 1B shows that the ILD0 152 and the CESL 151 are planarized to expose the gate electrode layer 116. The planarizing process can be a chemical-mechanical polishing (CMP) process. The planarization process removes excess ILD0 152 and CESL, and continues until the ILD0 152 and the CESL 151 on the gate structures, such as gate structures $140_A$ and $140_B$, are removed.

In order to replace the gate electrode layer 116 with other gate materials, the gate electrode layer 116 needs to be removed from gate structures $140_A$ and $140_B$ first. The gate electrode layer 116 may be removed by a wet etching process. If the gate electrode layer 116 is made of polysilicon, the wet etching solution(s) used may be a diluted HF solution, an NH$_4$OH solution, or solutions involving both diluted HF and NH$_4$OH, in accordance with some embodiments. For example, the wet etching may involve using a diluted HF solution with an HF to H$_2$O ratio in a range from about 1:50 to about 1:200 for a duration in a range from about 10 seconds to about 30 seconds first. Afterwards, the substrate is wet etched by a NH$_4$OH solution with an H$_2$O to NH$_4$OH ratio in a range from about 0 to 1 (pure NH$_4$OH) to about 50:1 for a duration in a range from about 10 seconds to about 30 seconds.

Figure 1C:
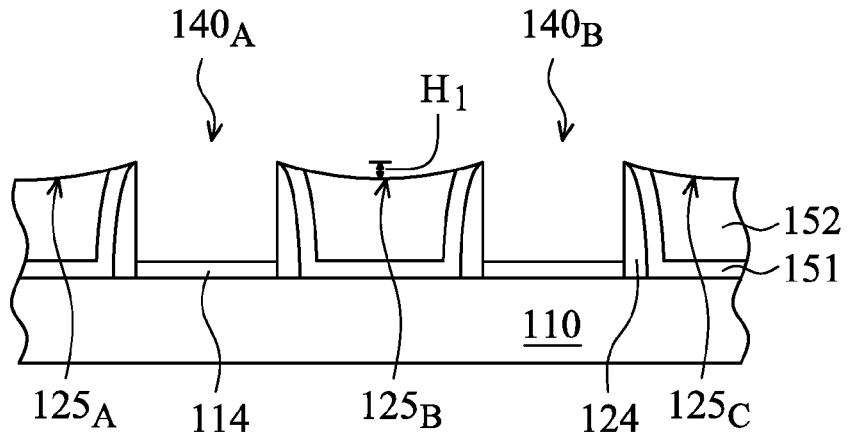

However, the wet etching solution(s) also etches ILD0 152. As a result, a portion of ILD0 152 is undesirably etched. FIG. 1C shows a cross-sectional view of the semiconductor device structure 100 after the gate electrode layer 116 has been removed by a wet etch solution (or chemistry), in accordance with some embodiments. FIG. 1C shows a loss of ILD0 152 with a thickness of $H_1$, which caused the ILD0 152 to dip below the top surface of gate structures $140_A$ and $140_B$. FIG. 1C shows the dipped regions $125_A$, $125_B$, and $125_C$ caused by the ILD0 152 loss. Thickness $H_1$ is in a range from about 10 Å to about 200 Å, in accordance with some embodiments. In some embodiments, prior to using a wet solution to remove the gate electrode layer 116, there is a dry etch, which is used to remove CMP residue and also possible remaining CESL 151 and ILD0 152 above the gate electrode layer 116 of gate structures $140_A$ and $140_B$. In some embodiments, the dry etching is a plasma etch with a mixture of HBr, Cl$_2$, and/or NF$_3$ as an etching gas. At least one of HBr, Cl$_2$, or NF$_3$ exists in the etching gas. The etching gas may also include an inert carrier gas, such as He, Ar, Ne, Kr, or Xe. In some embodiments, the dry etching pressure is in a range from about 5 mTorr to about 100 mTorr with an HBr flow rate in a range from about 0 sccm to about 500 sccm, a Cl$_2$ flow rate in a range from about 0 sccm to about 500 sccm, and an NF$_3$ flow rate in a range from about 0 sccm to about 500 sccm. In some embodiments, the RF power is in a range from about 100 Watts to about 200 Watts and the bias power is in a range from about 0 V to about 200 V. In some embodiments, the process time is in a range from about 10 seconds to about 180 seconds. The dry etching also contributes to the loss of ILD0 152. Spaces $130_A$ and $130_B$ are formed between spacers 124 after the dummy layer 116 is removed, as shown in FIG. 1C.

As mentioned above, the gate dielectric layer 114 could also be a dummy layer and could be removed, in accordance with some embodiments. The gate dielectric layer 114 is removed by dry etching using etchants, such as a mixture of HF and NH$_3$ (a non-plasma process) or a mixture of NF$_3$ and NH$_3$ (a remote plasma process), etc. The dry etching process can be a plasma process or a non-plasma process. The dry etchant(s) may also include an inert carrier gas, such as He, Ar, Ne, Kr, or Xe. In some embodiments, the oxide etch (or removal) is performed by using an etching gas including a mixture of HF and NH$_3$ to form a complex with the oxide film. Afterwards, the complex could be evaporated by heating the substrate. The heating is performed at a temperature between about 100° C. to about 200° C., in accordance with some embodiments. The etching and the heating to remove etch byproduct(s) are performed in the same chamber, in some embodiments. In some embodiments, the process is performed in a Certas-X etching tool, manufactured by Tokyo Electron Limited (TEL) of Tokyo, Japan. Details of the chemical reactions are described in U.S. patent application Ser. No. 12/704,032, entitled "A Novel Hard Mask Removal Method" and filed on Feb. 11, 2010, which is incorporated by reference herein in its entirety.

Figure 1D:
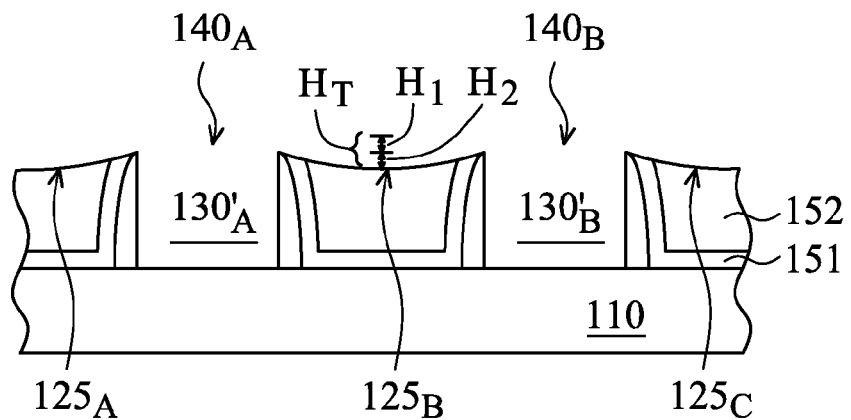

FIG. 1D shows additional loss of ILD0 152 due to the removal of the gate dielectric layer 114, in accordance with some embodiments. The additional loss of ILD0 152 has a thickness of $H_2$. In some embodiments, thickness $H_2$ is in a range from about 10 Å to about 200 Å. The total ILD0 152 loss is $H_T$, which is the total of $H_1$ and $H_2$. Spaces $130_A'$ and $130_B'$ are formed between spacers 124 after the dummy layers 116 and 114 are removed, as shown in FIG. 1C.

Figure 1E:
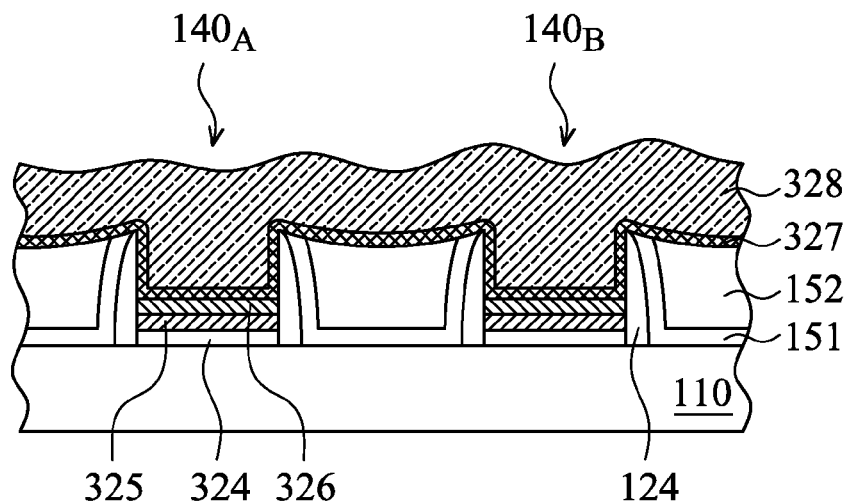

After the dummy gate electrode layer 116 and the dummy gate dielectric layer 114 are removed, a number of gate material layer are deposited to fill spaces 130A and 130B (or $130_A'$ and $130_B'$) to form gate structures. The number of gate material layers may include a high dielectric constant (high-K) layer 324, as described in the exemplary U.S. patent application Ser. No. 12/702,525 mentioned above in accordance with some embodiments. Underneath the high-k layer 324 there could be an interfacial oxide layer (not shown). Above the high-k dielectric layer there could be a barrier layer 325, which is used to protect the high-k layer 324. In some embodiments, there is a workfunction layer 326 above the barrier layer 325, as shown in FIG. 1E in accordance with some embodiments. The remaining portions of openings $130_A$ and $130_B$ (or $130_A'$ and $130_B'$) are then filled with a gate material (a conductive layer), such as aluminum, or other type of metal with low resistivity.

Figure 1F:
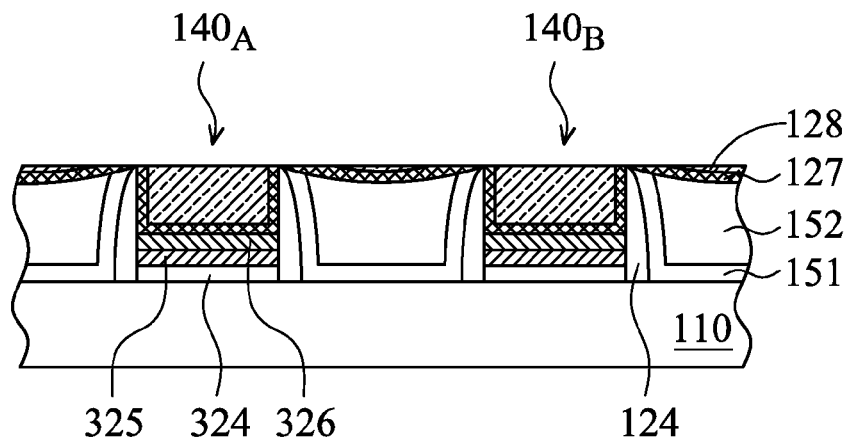

In some embodiments, an optional barrier/adhesion layer 327 is deposited under the gate metal layer 328. The barrier/adhesion layer 327 and the gate metal layer 328 may be deposited by CVD, PVD, ALD, or other applicable process. The barrier/adhesion layer 327 can be made of Ti, TiN, Ta, TaN, or a combination of Ti/TiN or Ta/TaN, in accordance with some embodiments. The description of gate material layers is merely an example. Other types or numbers of gate material layers are also possible. After the openings $130_A$ and $130_B$ (or $130_A'$ and $130_B'$) are filled, the excess conductive layers 327 and 328 above the ILD0 152 are removed. In some embodiments. The excess conductive layers 327 and 328 are removed by CMP. FIG. 1F shows the structure 100 of FIG. 1E after the CMP removal process, in accordance with some embodiments. Due to the ILD0 152 loss, traces of the conductive barrier layer 327 and the conductive layer 328 are left in the dipped regions $125_A$, $125_B$, and $125_C$, described above. Such traces of conductive layers could cause shorting of structures and reliability issues. Both issues could reduce the yield of dies. In order to remove the residual conductive layer(s), additional CMP of the conductive layer(s) may be applied. However, excessive metal CMP would shorten the height of the gate structure, which is not desirable. Therefore, it's important to resolve such issues.

Figure 2A:
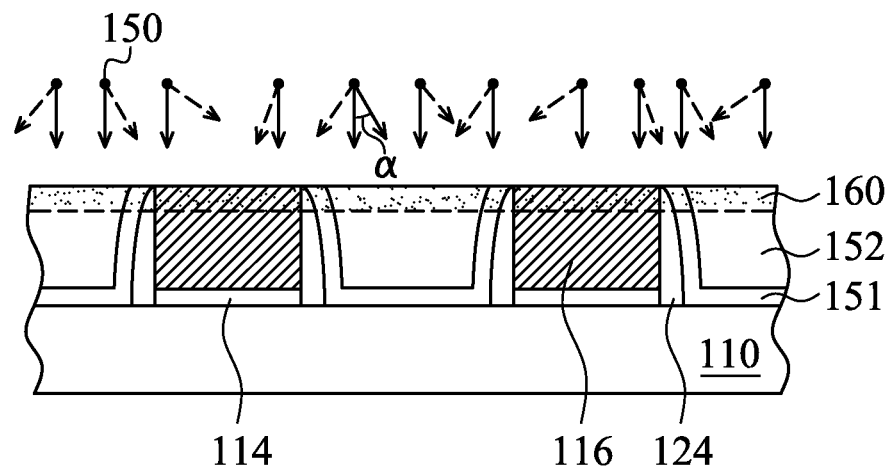
FIG. 2A shows the structure of FIG. 1B after the dielectric chemical-mechanical polish (CMP) to remove excess dielectric layers over the gate electrode layer of the gate structures, in accordance with some embodiments.

FIG. 2A shows the structure 100 of FIG. 1B after the dielectric CMP to remove excess dielectric layers 152 and 151 over the gate electrode layer 116 of gate structures $140_A$ and $140_B$, in accordance with some embodiments. To prevent excessive ILD0 152 loss during the removal processes of the gate electrode layer 116 and/or gate dielectric layer 114, dopants are implanted on the surface layer 160 of ILD0 152. The dopants may contain carbon (C), boron (B), or a combination thereof. The dopants reduce the etching rate of the doped ILD0 152 when the doped surface layer 160 is exposed to the etchants used to remove the dummy gate electrode layer 116 and the dummy gate dielectric layer 114.

In some embodiments, the dopants are made of carbon. FIG. 2A shows dopant being implanted into the surface layer (including ILD0 152) on the substrate 110 after CMP of ILD0 152 (as shown in FIG. 1B), in accordance with some embodiments. The doping (or implant) of carbon may be performed by ion beams (ion implantation, or beam line) or by plasma implantation. FIG. 2A shows carbon ions 150, being directed toward substrate 110 (shown as solid arrows) and implanted into the surface of substrate 110, in accordance with some embodiments.

If the doping is performed by ion beams, the dopants, which are ions, may be directed toward substrate 110 vertically (solid arrows), or tilted at an angle "α". The angle may be about zero or greater than zero. In some embodiments, the angle is in a range from about 0° to about 60°. In other embodiments, the angle is in a range from about 0° to about 30°. Due to the relative shallowness of the doped layer 160, the doping energy is relatively low. In some embodiments, the doping energy is in a range from about 0.5 KeV to about 60 KeV. The dopant concentration is in a range from about 5E18 atoms/cm³ to about 5E22 atoms/cm³, in accordance with some embodiments. In some embodiments, the dopant weight concentration is in a range from about 0.01% to about 100%. In some embodiments, the temperature of the implant process is in a range from about −150° C. to about room temperature (about 25° C.).

Figure 2B:
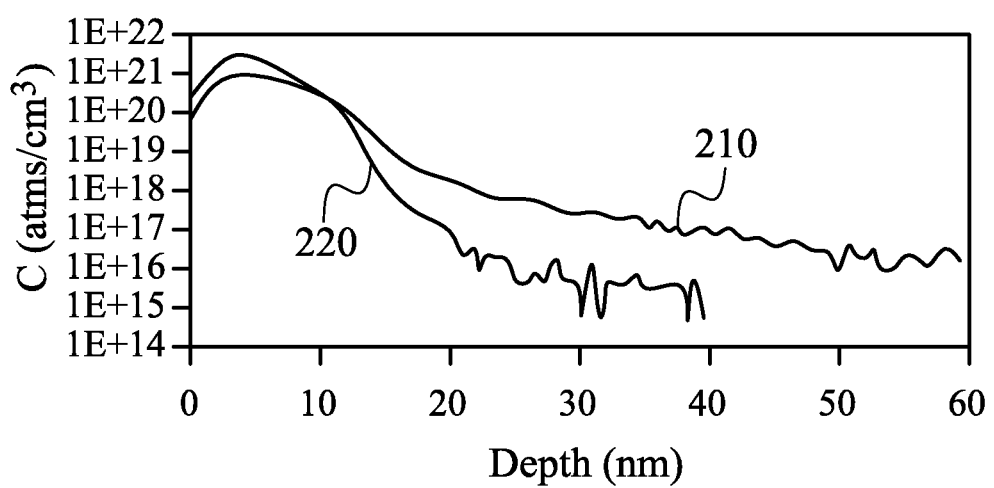
FIG. 2B shows dopant profiles as a function of depth for doping by ion beams and by plasma doping (PLAD), in accordance with some embodiments.

As mentioned above, the doping may also be achieved by plasma doping (or PLAD). Since the plasma ions in the plasma sheath could move in different directions, not just directed toward the substrate as is the case for the dopants from ion beams, the plasma ions 150 are illustrated by dotted arrows. Plasma ions often have lower energy than the ions of ion beams. As a result, plasma doping (or PLAD) is ideal for shallow doping. The dopant plasma ions 150 arrive at the substrate surface in a range of angles (shown as dotted arrows), instead of being at a certain angle as in the case of ion implantation by ion beams. FIG. 2B shows dopant profiles as a function of depth for doping by ion beams and by PLAD, in accordance with some embodiments. Curve 210 shows a dopant profile by ion beams and curve 220 shows a dopant profile by PLAD. PLAD can have higher surface concentration with a more rapid decrease in dopant concentration with depth, which indicates better depth control for shallow doping. In contrast, ion beam doping is suitable for deeper implants. If the depth T of the doping is less than about 800 Å, PLAD is used, in accordance with some embodiments. For larger dopant depth, either doping method (ion beams or PLAD) is used. In some embodiments, a depth (or thickness) of the doped region is in a range from about 2 nm to about 100 nm.

FIG. 2A shows a doped layer 160, in accordance with some embodiments. The dopants are not only implanted in the ILD0 152, but also implanted in the spacers 124, CESL 151, and the gate electrode layer 116. However, the depths of dopants could be different in different materials. For example, the depth in the gate electrode layer 116 could be larger or smaller than the depth in the ILD0 152.

Plasma doping is performed in a plasma doping system. An example of a plasma doping system is a PLAD system, made by Varian Semiconductor Equipment Associates Inc. of Gloucester, Mass. The doping gas is made by one or more dopant-containing gas. For example, if the dopant is carbon, one or more dopant containing gases, such as $CH_4$, $C_xH_y$, (where x and y are integers), or a combination thereof, are used. In some embodiments, x is in a range from 2 to 12 and y is in a range from 2 to 26. The doping gas may also include a carrier gas, such as $H_2$, $N_2$, He, Ar, Ne, Kr, Xe. The percentage of the dopant-containing gas may be in a range from about 1% to about 100%. In some embodiments, the process gas flow rate is in a range from about 50 sccm to about 500 sccm. In some embodiments, the pressure of the plasma process is in a range from about 5 mTorr, to about 50 mTorr. The RF (radio frequency) power is in a range from about 100 watts (W) to about 1000 W and at a radio frequency in a range from about 2 kilohertz (KHz) to about 13.6 megahertz (MHz), in accordance with some embodiments. The substrate may be or may not be biased. The dopant depth can be increased, if the substrate is biased. In some embodiments, the bias voltage is in a range from about 0 KV to about 10 KV. In some embodiments, the RF power supply can have dual frequencies. The doping plasma may be generated in the processing chamber or remotely (remote plasma). In some embodiments, the concentration of the dopant (carbon) is in a range from about 5E18 atoms/cm$^3$ to about 5E22 atoms/cm$^3$.

Figure 2C:
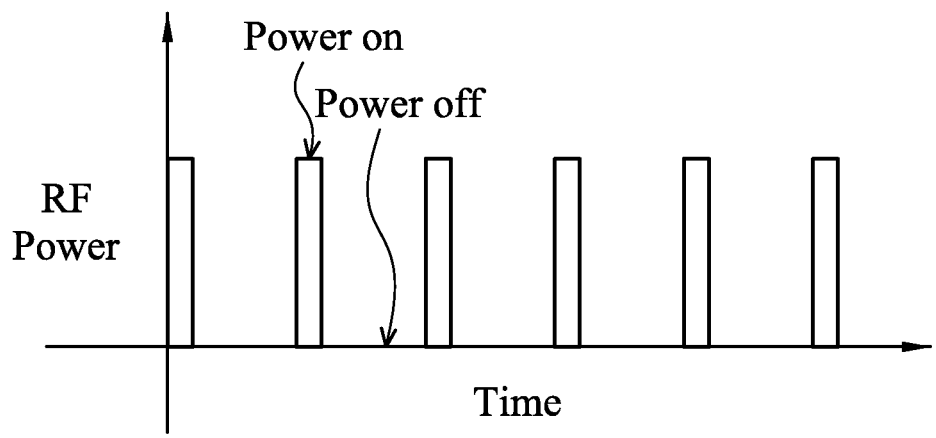
FIG. 2C shows a diagram of power cycle of a pulsed plasma, in accordance with some embodiments.

The radio frequency (RF) power for generating the plasma could be pulsed. FIG. 2C shows a diagram of power cycle of a pulsed plasma, in accordance with some embodiments. FIG. 2C shows that the RF power is turned on and off periodically. The duty ratio (power-on-time/total-time) of pulse could be in a range from about 5% to about 95% in accordance with some embodiments. In some embodiments, the plasma doping is performed for duration in a range from about 10 seconds to about 5 minutes.

Figure 2D:
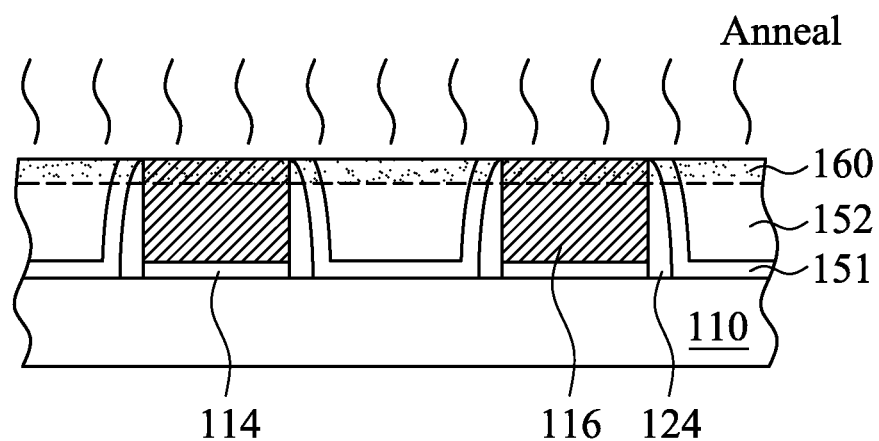
FIG. 2D shows the substrate of FIG. 2A being annealed after the doping process, in accordance with some embodiments.

After the doping is performed, the substrate may be annealed to allow the carbon atoms to settle in the oxide layer, in accordance with some embodiments. In some other embodiments, the anneal operation can be omitted. The annealing temperature may be in a range from about 350° C. to about 800° C., if a rapid thermal anneal (RTA) or furnace anneal is used in accordance with some embodiments. In some other embodiments, the anneal temperature can be up to about 1100° C. if a spike anneal is used. In yet some other embodiments, the anneal temperature can be as high as 1400° C. if millisecond anneal is used. In some embodiments, the annealing time can be in a range from about 50 μs is (micro seconds) to about 10 minutes. FIG. 2D shows the substrate of FIG. 2A being annealed after the doping process, in accordance with some embodiments. The heat can be provided to the front side of the substrate, backside of the substrate, or both front and back sides of the substrate.

Figure 3A:
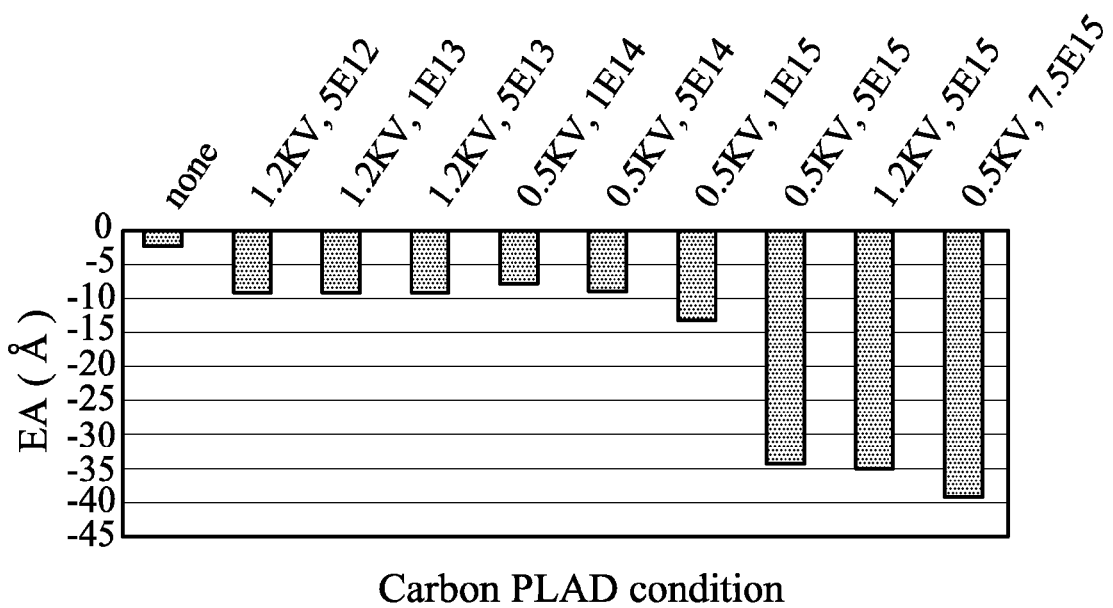
FIGS. 3A-3D show etch rate comparisons of oxide substrates doped with carbon by using PLAD, in accordance with some embodiments.
Figure 3B:
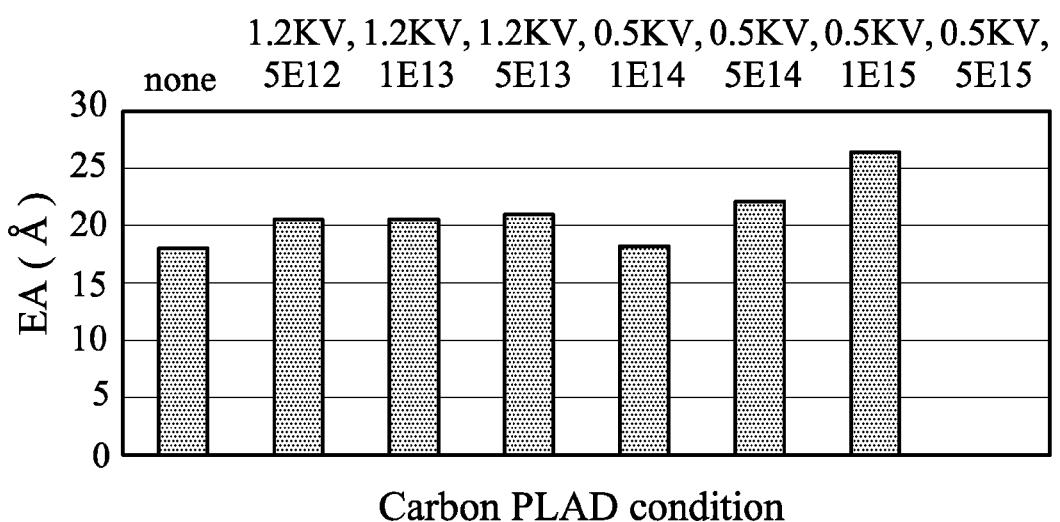
Figure 3C:
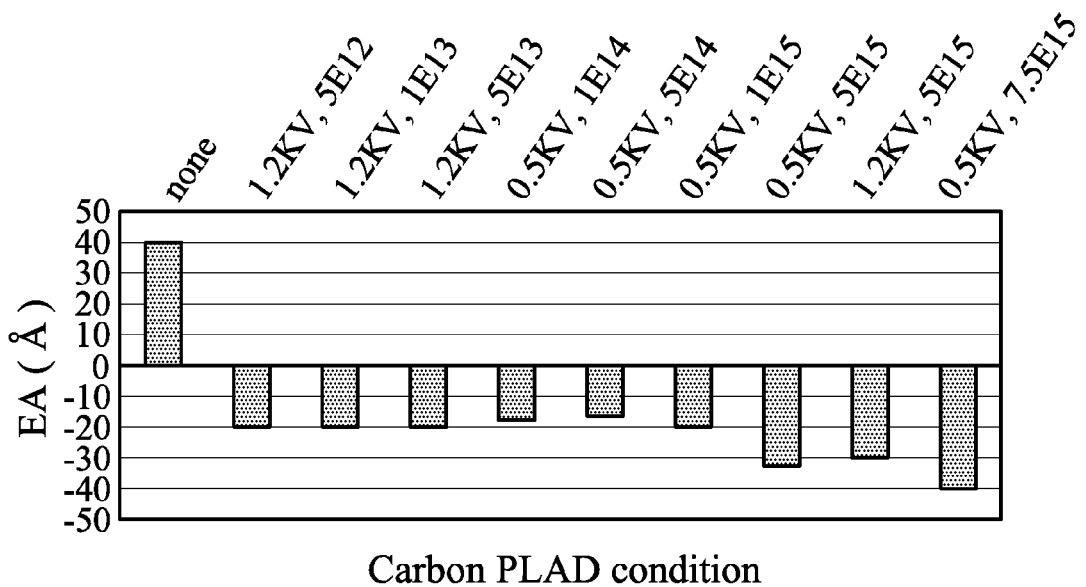

FIGS. 3A-3C show etch rate comparisons of oxide substrates doped with carbon by using PLAD, in accordance with some embodiments. In the examples shown in FIGS. 3A-3C, $CH_4$ is used a dopant gas. The process pressure, the $CH_4$ flow rate, the RF power, and the bias pulsing on-off ratio are kept the same for all different experimental splits. The bias voltage and dopant concentration are varied for different splits. The processing pressure is at about 4 mTorr, and the $CH_4$ flow rate is at about 80 sccm. The RF power is at about 725 Watts, and bias pulsing on/off ratio is at about 0.25 with about 80 μsecond pulse on time. The dosage setting on the system is varied from about 5E12 ions/cm$^2$ to about 7.5E15 ions/cm$^2$. The dosage setting range is selected to target dopant concentration in a range from about 5E18 atoms/cm$^3$ to about 5E22 atoms/cm$^3$. In general, higher dosage setting (in ions/cm$^2$) would result in higher dopant concentration (in atoms/cm$^3$). The bias voltage is varied from about 0.5 KV to about 1.2 KV.

The oxide is a PSG (P doped silicon glass) or a USG (undoped silicon glass) film deposited by high-density plasma CVD (HDPCVD). The P (phosphorus) concentration in the PSG film is in a range from about 0 wt % to about 5 wt %. FIG. 3A shows etch rate comparison of undoped oxide versus oxide doped with carbon under various dopant concentrations and bias voltages when the substrates are exposed to the polysilicon dry etch process (with HBr/Cl$_2$/NF$_3$ plasma), in accordance with some embodiments. The substrate that is not doped with carbon experiences an etching amount (EA) of close to zero, which indicates little loss of oxide due to the dry polysilicon etch. The results also show negative etching amount (EA) due to growth of a carbon film on the substrate surface. When the dosage setting is equal to or higher than about 5E15 ions/cm$^2$, bias voltage is equal to or higher than about 0.5 KV, and process time is in a range from about 10 seconds to about 180 seconds, the PLAD process results in a growth of carbon film with a thickness in a range from about 0 Å to about 500 Å. In some embodiments, the dopants are completely dispersed in the PSG or USG film and a carbon film is not formed on the substrate surface.

FIG. 3B shows an etch rate comparison of undoped oxide versus oxide doped with carbon under various dopant concentrations and bias voltages when the substrates are exposed to the polysilicon wet etch process (with diluted HF/NH$_4$OH), in accordance with some embodiments. The results show that the etch rates of doped oxides are relatively high until the dopant concentration is equal to or higher than about 5E15 atoms/cm$^3$ and bias voltage is equal to or higher than about 0.5 KV, which shows an etch rate that is much lower than the etch rate of undoped oxide. The etch time is in a range from about 20 seconds to about 600 seconds.

FIG. 3C shows etch rate comparison of undoped oxide versus oxide doped with carbon under various dopant concentrations and bias voltages when the substrates are exposed to an oxide dry etch process using HF/NH$_3$, in accordance with some embodiments. The results show that the carbon-doped oxide has very low etch rates. The negative etch rates of carbon-doped oxide films shown in FIG. 3C are due to formation of a thin carbon film on the oxide. Since the gate dielectric layer 114 is covered by the gate electrode layer 116 during the doping process, the gate dielectric layer 114 is not doped, if the doping process is relatively shallow and does not reach the gate dielectric layer 114. Therefore, the carbon-doped ILD0 152 is not etched when the un-doped gate dielectric layer 114 is removed.

Figure 3D:
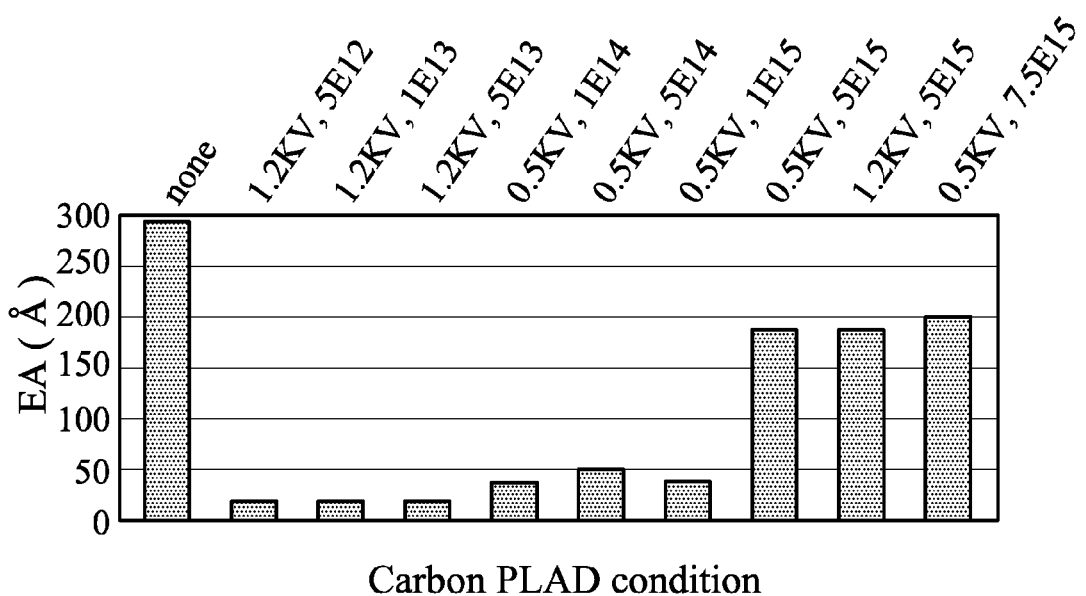

FIG. 3D shows etch rate comparison of dry etch rate of polysilicon with and without being exposed to the doping process, in accordance with some embodiments. The data show that the carbon-doped polysilion films all have lower etch dry etch (by HBr/Cl$_2$) rates compared to un-doped polysilicon. For a polysilicon film that is doped with a concentration equal to greater than about 5E15 atoms/cm$^3$ and with a bias voltage equal to or greater than 0.5 KV, the etch rates of the carbon-doped polysilicon are about 70% of the etch rate of undoped polysilicon. The results in FIG. 3D indicate that a longer etch time for gate electrode layer 116 after the doping process could be needed.

Based on the data of FIGS. 3A-3D, the PLAD doping dosage setting is equal to or greater than about 5E15 ions/cm$^2$, and the bias voltage is equal to or greater than about 0.5 KV in accordance with some embodiments. In some embodiments, the doping depth is in a range from about 10 Å to about 2000 Å. In some other embodiments, the doping depth is in a range from about 10 Å to about 200 Å. The residual carbon on the ILD0 152 would not cause negative side effects. For example, carbon doped oxide films normally have lower dielectric constants than doped oxide films.

Figure 4:
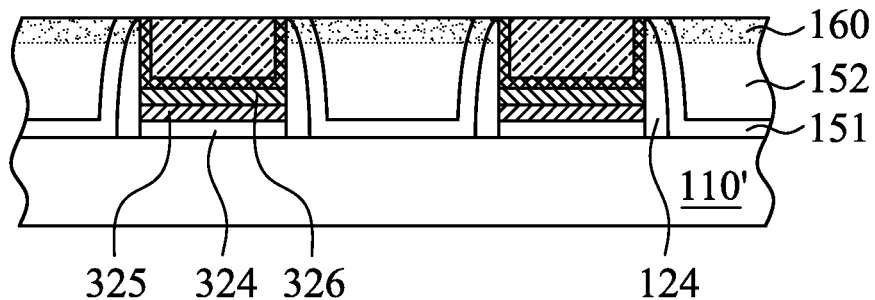
FIG. 4 shows a cross-sectional view of a substrate after a gate replacement process, in accordance with some embodiments.

FIG. 4 shows a cross-sectional view of a substrate 110' after a gate replacement process, in accordance with some embodiments. The gate replacement process has been described above in FIGS. 1A-1F. However, substrate 110' has experienced an additional doping process after the dielectric CMP process to form a doped layer 160. An anneal process could also have occurred after the doping process. FIG. 4 shows that the doped layer 160 reduces the loss of ILD0 152 during the removal of the dummy layer(s). As a result, no dipping of ILD0 152 between gate structures due to ILD0 152 loss during the removal of the dummy layer(s) occurs. Therefore, no residual conductive layer(s) is left on ILD0 152 and no excessive CMP of conductive layer(s) is needed.

Figure 5:
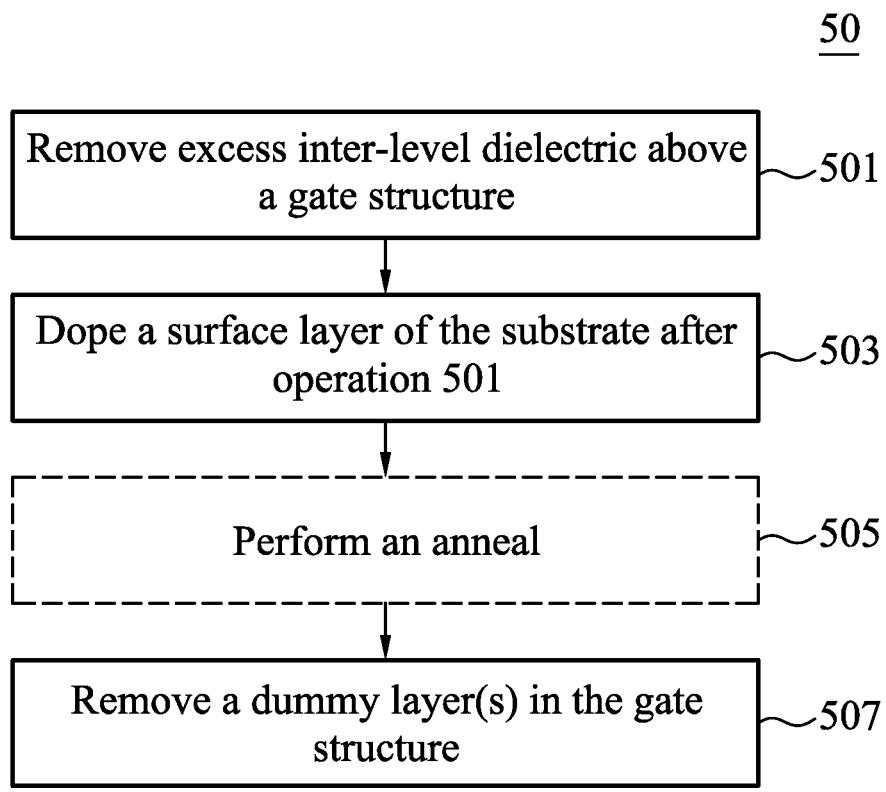
FIG. 5 shows a process flow for doping an inter-level dielectric layer surrounding a gate structure for a replacement gate process, in accordance with some embodiments.

FIG. 5 shows a process flow 500 of doping an inter-level dielectric layer surrounding a gate structure for a replacement gate process, in accordance with some embodiments. At operation 501, a substrate with a gate structure covered with the inter-level dielectric (ILD) layer is removed of excess ILD above the gate structure. A top surface of the gate structure is exposed after the removal process. The gate structure includes a dummy gate electrode layer and a dummy gate dielectric layer, in accordance with some embodiments. In some other embodiments, the gate structure includes a dummy gate electrode layer and the gate dielectric layer is not a dummy layer. In some embodiments, there is a contact etch stop layer (CESL) between the ILD layer and the gate structure. During operation 501, the CESL above the gate structure is also removed. At operation 503, a doping process is performed to dope a surface layer (including the surface layer of the ILD layer) on the substrate. The dopants implanted in the ILD layer can reduce the loss of the ILD layer during the removal of the dummy layer(s) in the gate structures. As mentioned above, dopants, such as carbon, may be doped into the ILD0. The doping process may be a plasma doping process (PLAD) or an ion beam doping process. After the dopants are implanted in the ILD layer, an optional anneal is performed at operation 505. The anneal may help the dopants settle in the ILD layer. In some embodiments, the anneal is not needed. Afterwards, the dummy layer(s) in the gate structure is removed at operation 507. In some embodiments, the dummy layers removed include a gate electrode layer and a gate dielectric layer. In some other embodiments, a dummy gate electrode layer is removed and the gate dielectric layer is not removed. After operation 507, additional operations may be performed to complete manufacturing integrated circuits (ICs) with the gate structure on the substrate. By doping the ILD as described above, the issues of residual conductive layer(s) on ILD are resolved and the yield of substrate is improved.

The embodiments of methods and structures disclosed herein provide mechanisms of performing doping an inter-level dielectric film, ILD0, surrounding the gate structures with a dopant to reduce its etch rates during the processes of removing a dummy gate electrode layer and/or gate dielectric layer for replacement gate technologies. The ILD0 film may be doped with a plasma doping process (PLAD) or an ion beam process. Post doping anneal is optional.

One aspect of this description relates to a device structure. The semiconductor device includes a first gate structure on a substrate and a second gate structure on the substrate. The semiconductor device further includes an inter-level dielectric (ILD) layer on the substrate between the first gate structure and the second gate structure, wherein a top portion of the ILD layer has a different etch selectivity than a bottom portion of the ILD layer.

Another aspect of this description relates to a device structure. The semiconductor device includes a first gate structure on a substrate and a second gate structure on the substrate. The semiconductor device further includes an inter-level dielectric (ILD) layer on the substrate between the first gate structure and the second gate structure, wherein the ILD layer comprises a doped top portion, and a height of the ILD is greater than a height of the doped top portion.

Still another aspect of this description relates to a semiconductor device. The semiconductor device includes a plurality of gate structures on a substrate. The semiconductor device further includes an inter-level dielectric (ILD) layer on the substrate between adjacent gate structures of the plurality of gate structures, wherein a top portion of the ILD layer has a different etch selectivity than a lower portion of the ILD layer. The semiconductor device further includes a contact etch stop layer (CESL) between each gate structure of the plurality of gate structures and the ILD layer. Each gate structure of the plurality of gate structures includes a gate stack and a spacer between the gate stack and the CESL.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device structure comprising:
a first gate structure on a substrate;
a second gate structure on the substrate, wherein the first gate structure and the second gate structure comprise:
 a gate dielectric layer, wherein an inter-level dielectric (ILD) layer is substantially free of the gate dielectric layer,
 a barrier layer on the gate dielectric layer,
 a work function layer on the barrier layer, and
 a conductive layer on the work function layer; and
the ILD layer on the substrate between the first gate structure and the second gate structure, the ILD layer comprising a top portion and a bottom portion below the top portion, wherein an entirety of the top portion has a lower etch rate than an entirety of the bottom portion in a dilute HF solution.

2. The device of claim 1, further comprising:
a first doped layer in a top portion of the first gate structure;
a second doped layer in a top portion of the second gate structure; and a third doped layer in the top portion of the ILD layer.

3. The device of claim 1, further comprising:
a contact etch stop layer (CESL) between the ILD layer and each of the first gate structure and the second gate structure;
a first spacer between the CESL and the first gate structure; and
a second spacer between the CESL and the second gate structure.

4. The device of claim 1, wherein a thickness of the top portion ranges from 2 nanometers (nm) to 100 nm, and a thickness of the ILD layer ranges from 1000 Angstroms (Å) to 5000 Å.

5. The device of claim 1, wherein a height of the top portion ranges from about 2 nanometers (nm) to about 100 nm.

6. The device of claim 1, wherein the top portion comprises a dopant comprising at least one of carbon or boron.

7. A device structure comprising:
a first gate structure on a substrate;
a second gate structure on the substrate, wherein the first gate structure and the second gate structure comprise:
 a gate dielectric layer, wherein an inter-level dielectric (ILD) layer is substantially free of the gate dielectric layer,
 a barrier layer on the gate dielectric layer,
 a work function layer on the barrier layer, and
 a conductive layer on the work function layer; and
the ILD layer on the substrate between the first gate structure and the second gate structure, wherein the ILD layer comprises a doped top portion, a height of the ILD layer is greater than a height of the doped top portion, and the height of the doped top portion ranges from about 2 nanometers (nm) to about 100 nm.

8. The device structure of claim 7, further comprising a spacer between the ILD layer and at least one of the first gate structure or the second gate structure, wherein the spacer comprises a doped top spacer portion, and a height of the spacer is greater than a height of the doped top spacer portion.

9. The device structure of claim 8, wherein the height of the doped top spacer portion is different from the height of the doped top portion.

10. The device structure of claim 7, further comprising a contact etch stop layer between the ILD layer and at least one of the first gate structure or the second gate structure, wherein the contact etch stop layer has a doped top etch stop layer portion, and the doped top etch stop layer portion is less than an entirety of the etch stop layer.

11. The device structure of claim 10, wherein a height of the doped top etch stop layer portion is different from the height of the doped top portion.

12. The device structure of claim 7, wherein a top surface of the ILD layer is substantially level with a top surface of the first gate structure and a top surface of the second gate structure across an entirety of the ILD layer.

13. The device structure of claim 7, wherein the doped top portion comprises a dopant comprising at least one of carbon or boron.

14. A semiconductor device comprising:
 a plurality of gate structures on a substrate;
 an inter-level dielectric (ILD) layer on the substrate between adjacent gate structures of the plurality of gate structures, wherein a top portion of the ILD layer has a different etch selectivity than a lower portion of the ILD layer, and a depth of the top portion ranges from about 2 nanometers (nm) to about 100 nm; and
 a contact etch stop layer (CESL) between each gate structure of the plurality of gate structures and the ILD layer, wherein each gate structure of the plurality of gate structures comprises:
 a gate stack; and
 a spacer between the gate stack and the CESL.

15. The semiconductor device of claim 14, wherein the CESL comprises a first portion adjacent the top portion, the first portion having a different etch selectivity than a second portion of the CESL.

16. The semiconductor device of claim 14, wherein the spacer has a top spacer portion having an etch selectivity different from an etch selectivity of a lower portion of the spacer.

17. The semiconductor portion of claim 14, wherein the top portion comprises a dopant comprising at least one carbon or boron.

18. The semiconductor device of claim 14, wherein the gate stack comprises:
 a high-k gate dielectric layer;
 a barrier layer on the high-k gate dielectric layer;
 a work function layer on the barrier layer;
 a gate conductive layer on the work function layer; and
 a conductive barrier layer between gate conductive layer and the work function layer and between the gate conductive layer and the spacer.

* * * * *